(12) United States Patent
Hara

(10) Patent No.: US 7,671,680 B2
(45) Date of Patent: Mar. 2, 2010

(54) ELECTRONIC CIRCUIT

(75) Inventor: Hiroshi Hara, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 80 days.

(21) Appl. No.: 11/727,686

(22) Filed: Mar. 28, 2007

(65) Prior Publication Data
US 2007/0229162 A1 Oct. 4, 2007

(30) Foreign Application Priority Data
Mar. 30, 2006 (JP) ............... 2006-094712
Feb. 23, 2007 (JP) ............... 2007-044467

(51) Int. Cl.
*H03G 3/10* (2006.01)
(52) U.S. Cl. ............ 330/281; 330/129; 330/136; 330/141; 455/234.1
(58) Field of Classification Search ......... 330/281, 330/129, 136, 141; 455/234.1, 239.1, 240.1
See application file for complete search history.

(56) References Cited

U.S. PATENT DOCUMENTS

| | | | |
|---|---|---|---|
| 3,809,960 A * | 5/1974 | Jossic | 361/25 |
| 4,415,803 A * | 11/1983 | Muoi | 250/214 A |
| 4,805,236 A * | 2/1989 | Urala | 398/202 |
| 5,111,324 A * | 5/1992 | Jahromi | 398/202 |
| 5,329,115 A * | 7/1994 | Lim | 250/214 R |
| 5,507,023 A * | 4/1996 | Suganuma et al. | 455/234.1 |
| 5,646,758 A * | 7/1997 | Miki et al. | 398/100 |
| 6,057,951 A * | 5/2000 | Sugawara | 398/209 |
| 6,081,558 A * | 6/2000 | North | 375/316 |
| 6,082,265 A * | 7/2000 | Sakamoto et al. | 102/206 |
| 6,232,842 B1 * | 5/2001 | Asano | 330/308 |
| 6,242,732 B1 * | 6/2001 | Rantakari | 250/214 A |
| 6,324,694 B1 * | 11/2001 | Watts et al. | 725/32 |
| 6,587,003 B2 * | 7/2003 | Jordanov | 330/308 |
| 6,720,827 B2 * | 4/2004 | Yoon | 330/85 |
| 6,798,282 B1 * | 9/2004 | Broekaert et al. | 330/51 |
| 6,909,082 B2 * | 6/2005 | Doh et al. | 250/214 AG |
| 7,050,724 B1 * | 5/2006 | Rantakari | 398/209 |
| 7,058,315 B2 * | 6/2006 | Brewer et al. | 398/202 |

(Continued)

FOREIGN PATENT DOCUMENTS

JP      05-075544 A      3/1993

(Continued)

OTHER PUBLICATIONS

Notification of Reason(s) for Refusal in Office Action issued on Sep. 15, 2009 in corresponding Japanese patent application No. 2007-044467.

*Primary Examiner*—Patricia Nguyen
(74) *Attorney, Agent, or Firm*—Westerman, Hattori, Daniels & Adrian, LLP

(57) ABSTRACT

An electronic circuit includes an input terminal, a transimpedance amplifier connected to the input terminal and including an amplifier and a feedback resistor, a first time constant circuit smoothing an output from the transimpedance amplifier, a gain control circuit arranged between the input terminal and ground potential and controlling current flowing between the input terminal and the ground potential on the basis of the output from the first time constant circuit, and a safeguard circuit controlling the gain control circuit and blocking the current flowing between the input terminal and the ground potential, when a signal to be input into the input terminal is stopped.

7 Claims, 7 Drawing Sheets

U.S. PATENT DOCUMENTS

| | | | |
|---|---|---|---|
| 7,123,098 B2 * | 10/2006 | Bae et al. | 330/308 |
| 7,266,312 B2 * | 9/2007 | Doh et al. | 398/210 |
| 7,330,670 B2 * | 2/2008 | Doh et al. | 398/209 |
| 2007/0098416 A1 * | 5/2007 | Nogami et al. | 398/208 |

FOREIGN PATENT DOCUMENTS

| | | |
|---|---|---|
| JP | 11-330878 A | 11/1999 |
| JP | 2003-258580 A | 9/2003 |

* cited by examiner

US 7,671,680 B2

ELECTRONIC CIRCUIT

BACKGROUND OF THE INVENTION

1. Field of the Invention

This invention generally relates to electronic circuits, and more particularly, to an electronic circuit having a control circuit that controls a gain of an amplifier by use of an output from the amplifier.

2. Description of the Related Art

A description will now be given of, for example, a transimpedance amplifier (hereinafter, referred to as TIA) as an electronic circuit having an automatic gain control circuit (hereinafter, referred to as AGC circuit, gain control circuit) therein. The AGC circuit controls a gain of an amplifier by use of an output from the amplifier used as an amplifier for optical communication. A TIA is an amplifier circuit that converts current into voltage and amplifies the voltage, and is used for, for example, optical communication. At a light receiving side of the optical communication, a light receiving element such as a photo diode or the like converts the beam transmitted by means of the optical fiber into current. The TIA amplifies the current output from the light receiving element to output as a voltage signal. The input into the TIA is composed of input current of DC component and input signal of high-frequency component. There is an input current range that the TIA can amplify with high sensitivity. For this reason, if the magnitude of the input current is varied by a large amount, the TIA cannot amplify the input signal with high sensitivity. Therefore, in some cases, the TIA includes an AGC circuit. The AGC circuit controls the gain of the TIA according to the output voltage of the TIA. If the output voltage of the TIA is small, the AGC circuit does not control the gain. However, as the output voltage is increased, the gain of the TIA is decreased. It is therefore possible to produce an amplifier that operates with high sensitivity, from a small input current to a large one. Not only an optical signal of weak current but also that of a strong one can be amplified with high sensitivity, by amplifying the output current of the light receiving element by use of the TIA circuit that includes the AGC circuit therein. Japanese Patent Application Publication No. 2003-258580 discloses the TIA circuit that includes the AGC circuit therein.

It is to be noted that the output from the amplifier is inappropriately reflected on the gain control of the amplifier, in the amplifier that includes the AGC circuit therein. For example, if the signal to be input into the TIA that includes the AGC circuit therein is blocked off, the voltage output from the TIA will abnormally become high and a circuit at the subsequent stage will malfunction.

SUMMARY OF THE INVENTION

The present invention has been made in view of the above circumstances and provides an electronic circuit that can prevent an output from an amplifier such as an optical communication amplifier, a TIA, or the like from being reflected on a gain control of the amplifier in an inappropriate manner.

According to one aspect of the present invention, there is provided an electronic circuit comprising: an input terminal; a transimpedance amplifier connected to the input terminal and including an amplifier and a feedback resistor; a first time constant circuit smoothing an output from the transimpedance amplifier; a gain control circuit arranged between the input terminal and ground potential and controlling current flowing between the input terminal and the ground potential on the basis of the output from the first time constant circuit; and a safeguard circuit controlling the gain control circuit and blocking the current flowing between the input terminal and the ground potential, when a signal to be input into the input terminal is stopped. This makes it possible to prevent the gain control circuit from reflecting the output voltage from the transimpedance amplifier on the gain control of the transimpedance amplifier in an inappropriate manner.

According to another aspect of the present invention, there is provided an electronic circuit including: an input terminal; an amplifier connected to the input terminal; a time constant circuit smoothing an output from the amplifier; a gain control circuit arranged between the input terminal and ground potential and controlling current flowing between the input terminal and the ground potential on the basis of the output from the time constant circuit; and a safeguard circuit controlling the gain control circuit and blocking the current flowing between the input terminal and the ground potential, when a signal to be input into the input terminal is stopped.

BRIEF DESCRIPTION OF THE DRAWINGS

Exemplary embodiments of the present invention will be described in detail with reference to the following drawings, wherein.

DESCRIPTION OF THE PREFERRED EMBODIMENTS

A description will now be given, with reference to the accompanying drawings, of exemplary embodiments of the present invention.

Figure 1:
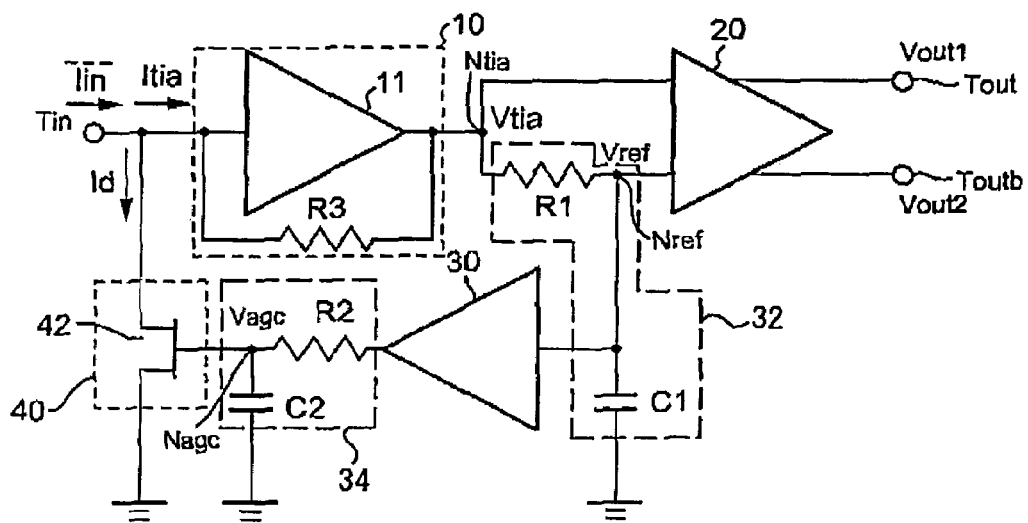
FIG. 1 shows a circuit diagram of an electronic circuit having a TIA therein, according to a comparison example.

Firstly, a description will be given of a case where the voltage output from a TIA cannot be reflected on the gain control of the TIA. FIG. 1 shows a circuit diagram of an electronic circuit having a TIA therein, according to a comparison example. For example, an output from a light receiving element is input into a TIA 10 from a terminal Tin. An input signal and an input current Itia are input into the TIA 10. An amplifier 11 and a feedback resister R3 are connected in parallel in the TIA 10. An output voltage Vtia is output from the TIA 10 to a node Ntia. The voltage Vtia is smoothed by a low-pass filter made up of a resistor RI and a capacitor Cl, and a voltage Vref is available at a node Nref. The resistor Ri and the capacitor C I compose a time constant circuit 32 (low-pass filter). The voltage Vtia is smoothed by the time constant circuit 32, resulting in the voltage Vref at the node Nref. A differential amplifier circuit 20 performs a differential amplification on the output voltage Vtia of the TIA 10 and the smoothed voltage Vref, and respectively outputs output voltages Vout1 and Vout2 at output terminals Tout and Toutb. The output voltages Vout1 and Vout2 are differential signals. In this manner, by performing the differential amplification on the smoothed voltage Vref and the output voltage Vtia of the TIA 10, the input current Itia applied to the TIA 10 can be converted into voltage.

The voltage Vref at the node Nref is amplified at an amplifier 30, and is smoothed by a time constant circuit 34 (low-pass filter) made up of a resistor R2 and a capacitor C2, so that a voltage Vagc is output to a node Nagc. The voltage Vagc is input into the gate of an N-type FET 42 of a control circuit 40 (gain control circuit) serving as an AGC circuit. The source and the drain of the FET 42 are respectively connected to ground (ground potential) and an input terminal Tin of the TIA 10.

In the comparative example, when an input current Iin into the terminal Tin is small, the voltage Vref is low and the voltage Vagc is low. Accordingly, the FET 42 turns off, no current flows from the terminal Tin to ground, and all current input into the terminal Tin is input into the TIA 10. As the current input into the terminal Tin is increased, the voltage Vagc becomes higher. This turns on the FET 42 and current input into the terminal Tin partially flows to ground as shunt current Id. Therefore, the current input into the TIA 10 is decreased. In this manner, the control circuit 40 controls the current Id flowing between the input terminal Tin and the ground potential, according to the output voltage Vtia of the TIA 10 (that is, the output from the time constant circuit 32). This controls the input current Itia into the TIA 10, and then the gain of the TIA 10 is controlled. Therefore, it is possible to amplify the input current Iin ranging from small to large, with high sensitivity.

Figure 2:
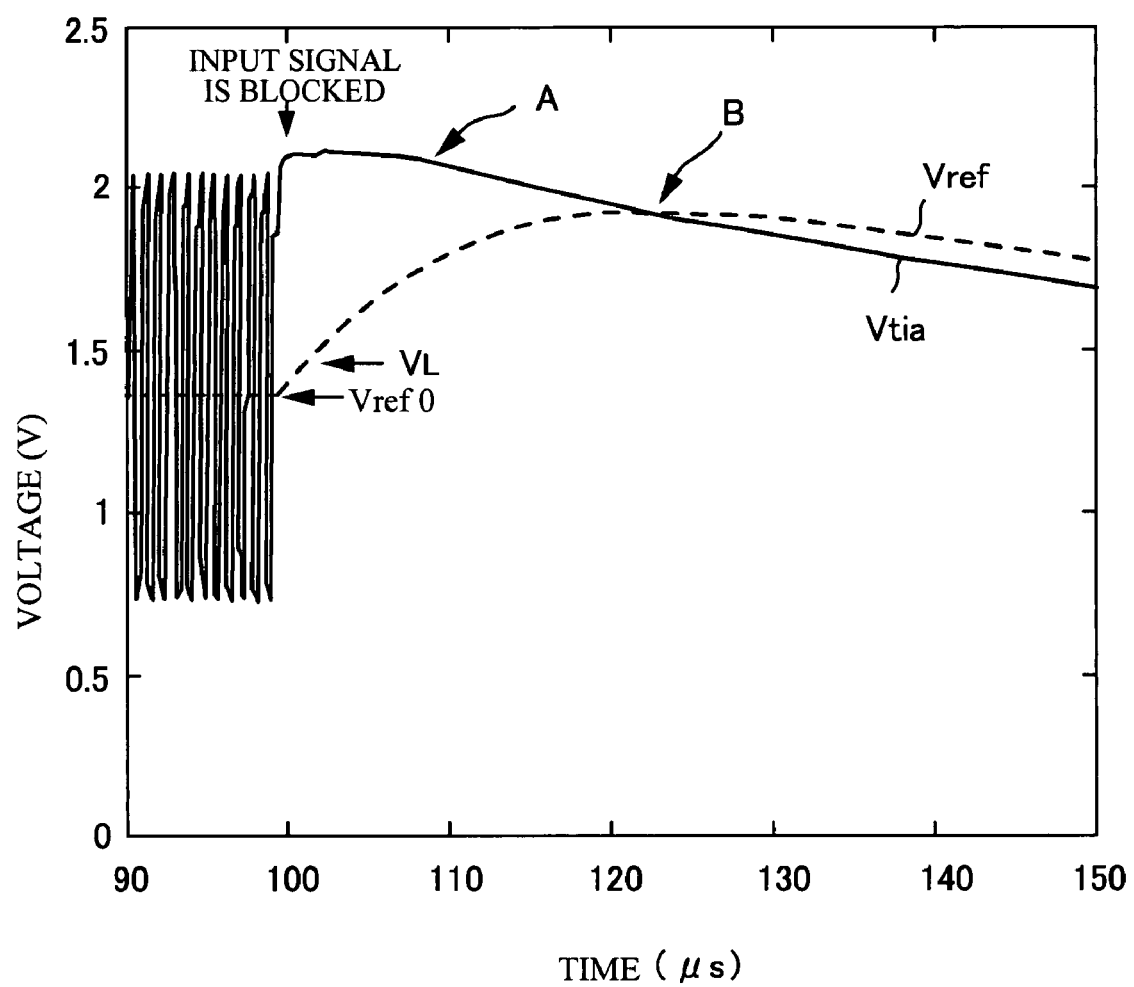
FIG. 2 is a first view explaining a problem of the electronic circuit of the comparison circuit.

Next, a description will be given of an example where the control circuit 40 cannot reflect the output voltage Vtia of the TIA 10 on the input current Itia thereof in an appropriate manner, in the electronic circuit of the comparative example. FIG. 2 shows the output voltage Vtia and the smoothed voltage Vref with respect to time, when an input signal is blocked off, while the input current Iin large enough to cause the AGC circuit to function is being input into the terminal Tin. Until the time reaches 100 μs, the input current Iin of the DC component of the input and the input signal are input into the terminal Tin. While the input signal is being input, the output voltage Vtia of the TIA 10 is a high-frequency signal centering approximately 1.35 V. Meanwhile, the smoothed voltage Vref is approximately 1.35 V as a smoothed voltage Vref0 of the output voltage Vtia. The voltage Vref0 corresponds to the output voltage of the TIA 10 with respect to the input current Itia of the TIA 10.

A consideration will now be given to a case where the output voltage Vtia is a peak voltage when the input signal is blocked off. It is ideal that the output voltage Vtia be back to 1.35 V, which is a voltage corresponding to no input of the input current Itia from the TIA 10. However, since the voltage Vagc applied to the FET 42 has two time constants of the resistor R1 and the capacitor C1, and the resistor R2 and the capacitor C2, the voltage Vagc cannot become low immediately. Then, the FET 42 keeps on and the current Id flows. Accordingly, the current flows across the feedback resistor R3, making the output voltage Vtia of the TIA 10 greater. Here, the voltage Vref in FIG. 2 gradually increases. This is because, as the voltage Vtia increases, the voltage Vref also increases in accordance with the voltage Vtia. While the voltage Vtia is higher than the voltage Vref, charge is stored in the time constant circuit composed of the resistor R1 and the capacitor C1. Then, the output voltage Vtia of the TIA gradually decreases. However, since the voltage Vref is connected to the time constant circuit 32, the voltage drop of the voltage Vref is delayed from that of the voltage Vtia due to the charge stored in the time constant circuit 32. As a result, the voltage Vref is greater than the voltage Vtia at B in FIG. 2.

Figure 3:
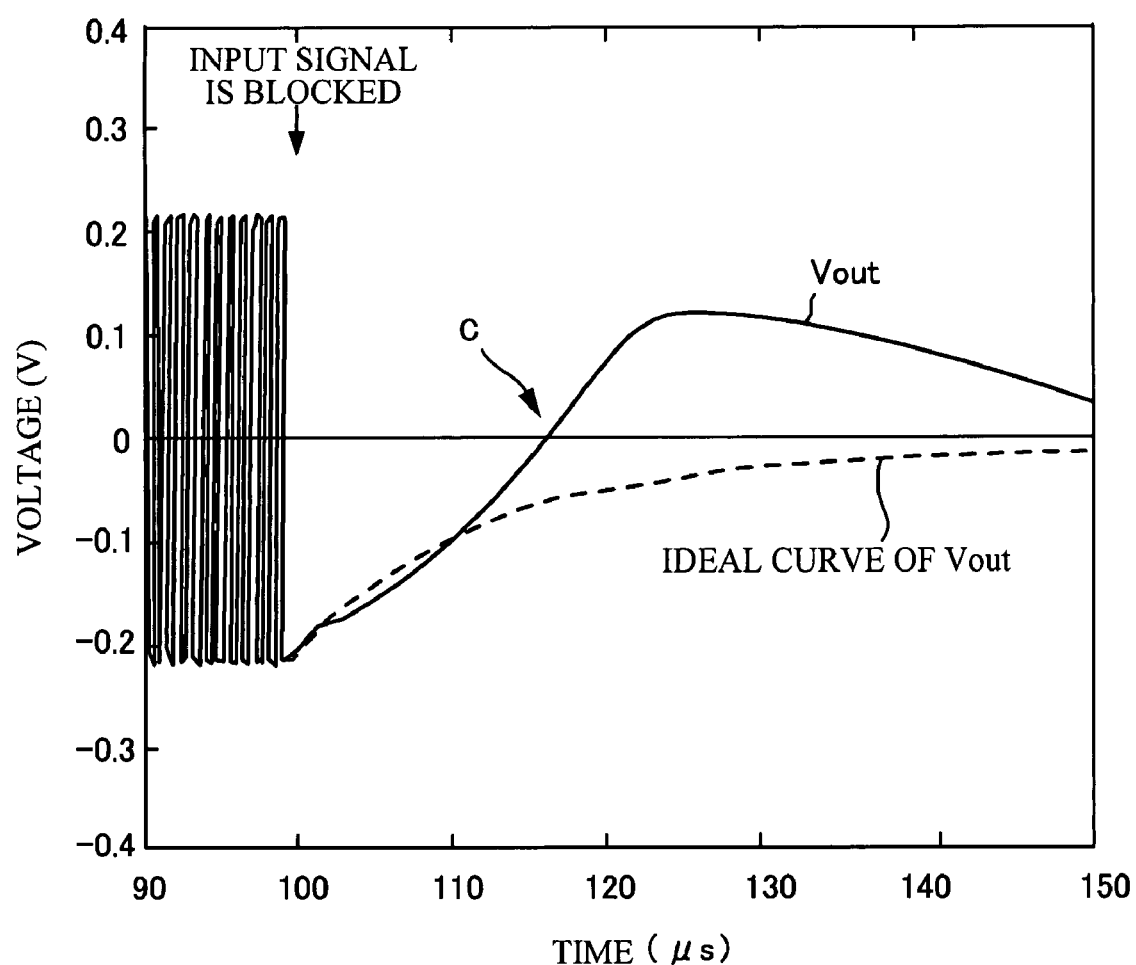
FIG. 3 is a second view explaining another problem of the electronic circuit of the comparison circuit.

FIG. 3 shows the output voltage Vout of the differential amplifier circuit 20 with respect to time, when the operation is same as FIG. 2. The output voltage Vout corresponds to a difference between the voltage Vtia and the voltage Vref. When the input signal is blocked in case where the voltage Vtia is a peak voltage as shown in FIG. 2, it is ideal that the voltage Vout be gradually close to 0 V, as indicated by the dotted line in FIG. 3. However, since the voltage Vref is greater than the voltage Vtia as described with reference to FIG. 2, the voltage Vout is greater than 0 V at C in FIG. 3. In other words, the voltage Vout overshoots. Then, a circuit that follows the differential amplifier circuit 20 operates, in some cases, as if the input signal were input into the TIA 10. As described heretofore, in the comparative example, when the output voltage Vtia from the TIA 10 is seen as abnormal, the control circuit 40 controls the input current Itia into the TIA 10 in an abnormal manner. That is to say, the control circuit 40 controls the gain of the TIA 10 in an abnormal manner. A description will be given of exemplary embodiments of the present invention so as to address the above-described problem.

First Exemplary Embodiment

Figure 4:
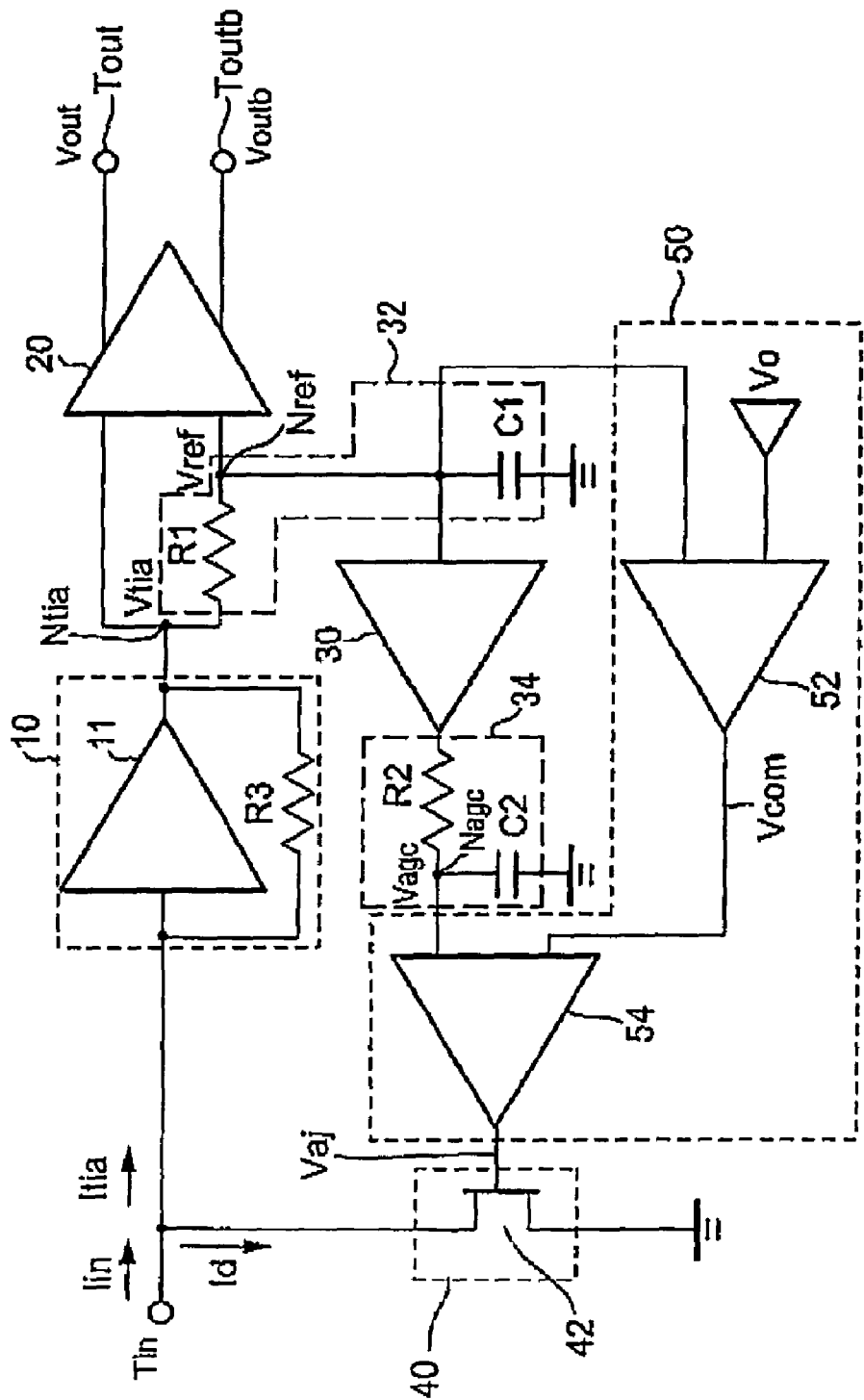
FIG. 4 is a circuit diagram of an electronic circuit in accordance with a first exemplary embodiment of the present invention.

FIG. 4 is a circuit diagram of an electronic circuit in accordance with a first exemplary embodiment of the present invention. As compared to FIG. 1 of the comparative example, a safeguard circuit 50 having a comparison circuit 52 and a suppressor circuit 54 is provided. The smoothed voltage Vref (hereinafter, in the first exemplary embodiment, also referred to as determination voltage) and a reference voltage V0 are input into the comparison circuit 52. The reference voltage V0 may be, for example, a voltage VL, to which a given voltage is shifted from the voltage Vref0 of FIG. 2. An output Vcom from the comparison circuit 52 and the voltage Vagc at the node Nagc are input into the suppressor circuit 54. An output voltage Vaj of the suppressor circuit 54 is input into the gate of the FET 42 of the control circuit 40 (gain control circuit). In the first exemplary embodiment, the same components and configurations as those of FIG. 1 have the same reference numerals and a detailed explanation will be omitted.

Figure 5:
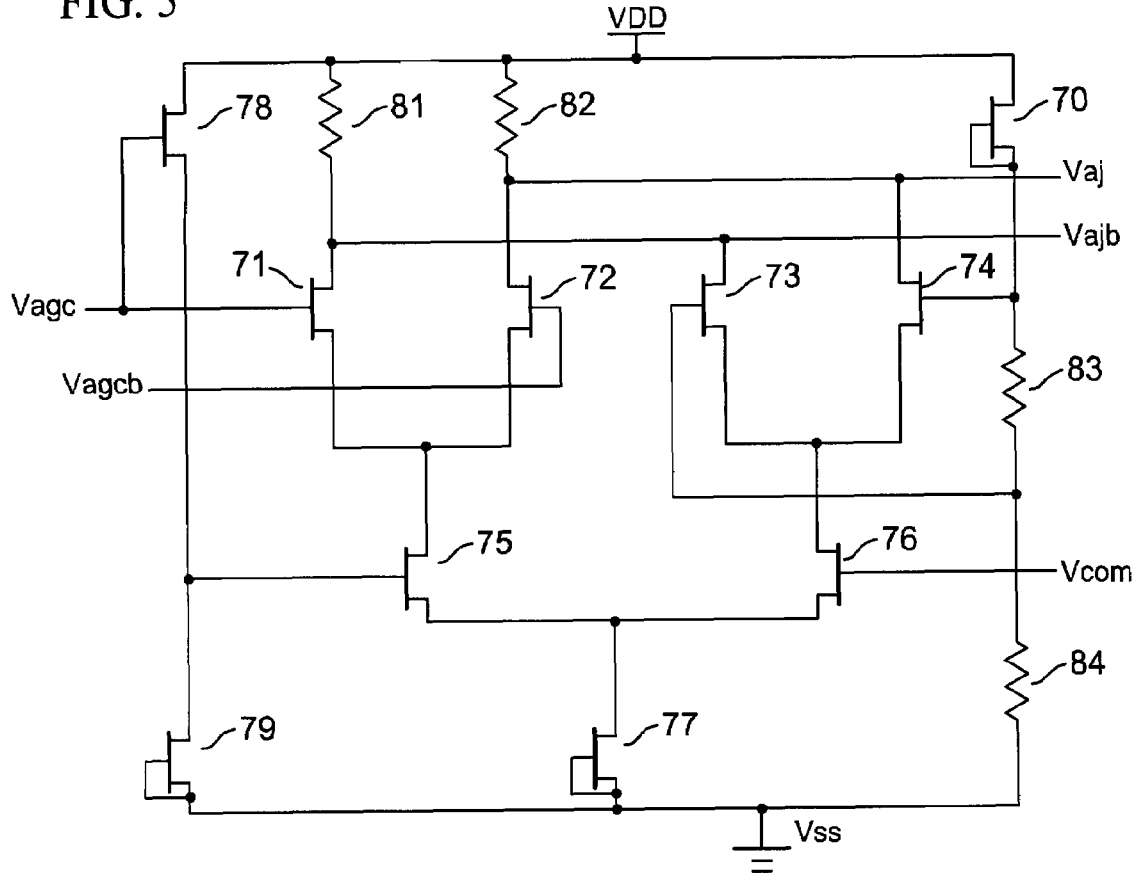
FIG. 5 is a circuit diagram of a suppressor circuit in accordance with the first exemplary embodiment of the present invention.

FIG. 5 is a circuit diagram of the suppressor circuit 54. The suppressor circuit 54 includes: FETs 70 through 79; and the resistors 81 through 84. The voltage Vagc at the node Nagc and the differential voltage Vagcb thereof are respectively input into the gate of an FET 71 and that of an FET 72. The output voltage Vcom from the comparison circuit 52 is input into the gate of an FET 76. When the voltage Vcom is a low level, the FET 76 turns off. Then, the voltage Vagc and the voltage Vagcb are inverted and amplified, and are output as an output voltage Vajb from the suppressor circuit 54 and a differential signal Vaj thereof. On the other hand, when the voltage Vcom is a high level, an FET 73 and an FET 74 operate. A low level voltage is input into the gate of the FET 73 as a voltage in which the difference in potential between the power supply VDD and ground Vss is divided by the FET 70 and resistors R83 and R84. This turns off the FET 73 and makes the differential signal Vajb to a high level. A high level is input into the gate of the FET 74 as a voltage in which the difference in potential between the power supply VDD and the ground Vss is divided by the FET 70 and the resistors 83 and 84. This turns on the FET 74, and makes the differential signal Vaj to a low level. The suppressor circuit 54 outputs the differential signal Vaj to the FET 42 of the control circuit 40.

Table 1 shows voltages and operations of the FET 42 when the determination voltage Vref is greater than the reference voltage V0, and when the determination voltage Vref is equal to or smaller than the reference voltage V0. When the determination voltage Vref is greater than the reference voltage V0, the comparison circuit 52 outputs a high level as a voltage Vcom. The suppressor circuit 54 outputs a low level. Accordingly, the FET 42 of the control circuit 40 turns off and the current Id does not flow. On the other hand, when the determination voltage Vref is equal to or smaller than the reference voltage V0, the comparison circuit 52 outputs a low level as a voltage Vcom. The suppressor circuit 54 outputs Vagc. Accordingly, the FET 42 controls the current Id with the voltage corresponding to the voltage Vagc.

TABLE 1

|  | Vcom | Vaj | FET 42 |
|---|---|---|---|
| Vref > V0 | High | Low | Off |
| Vref <= V0 | Low | Vagc | Control |

Figure 6:
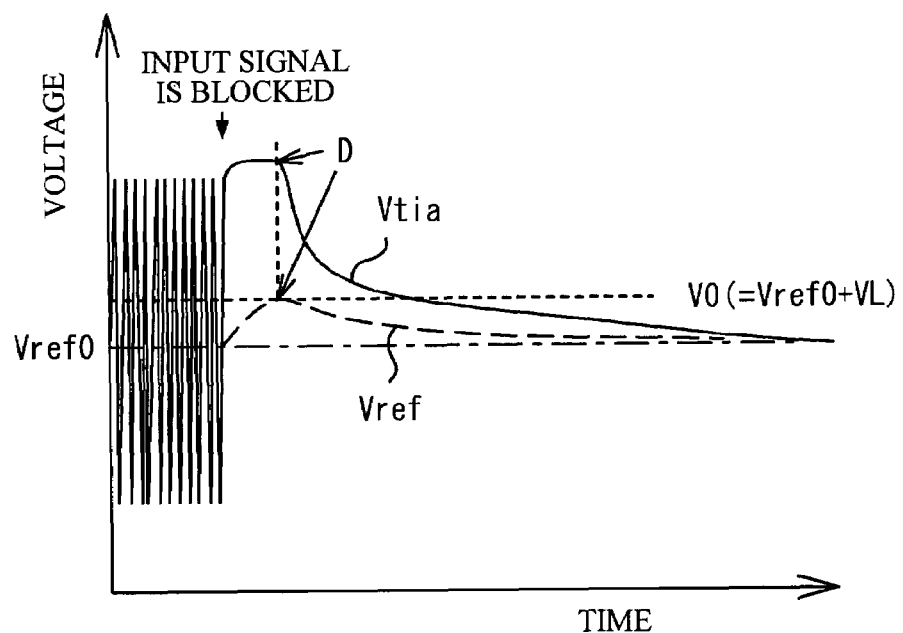
FIG. 6 is a schematic view of voltages Vref and Vtia with respect to time in accordance with the first exemplary embodiment of the present invention.

FIG. 6 is a schematic view of the output voltage Vtia of the TIA 10 and the determination voltage Vref with respect to time, when the determination voltage Vref is greater than the reference voltage V0 (Vref0+VL) in Table 1 and the FET 42 is switched off. Referring to FIG. 6, when the input signal is blocked in a similar manner to FIG. 2, the voltage Vtia slightly increases and the determination voltage Vref gradually increases. When the determination voltage Vref is greater than the reference voltage V0 at D, the FET 42 is switched off as shown in Table 1. This stops the current from flowing from the node Ntia across the feedback resistor R3 of the TIA 10. Then, as the voltage Vtia decreases, the determination voltage Vref smoothing the voltage Vtia decreases. In this manner, the determination voltage Vref is prevented from being higher than the voltage Vtia. By causing the reference voltage V0 to be closer to the voltage Vref0, it is possible to prevent the determination voltage Vref from being higher than the voltage Vtia. However, if the reference voltage V0 is too closer to the voltage Vref0, this will lead to malfunction. The reference voltage V0 may be set in an appropriate manner in consideration of the afore-mentioned circumstances.

As shown in FIG. 6, when a signal to be input into the input terminal Tin is stopped (for example, it is determined that the input signal is stopped when the determination voltage Vref exceeds the voltage V0), the control circuit 40 is controlled (the FET 42 is turned off) and the current Id flowing between the input terminal Tin and the ground potential is blocked. In this manner, when the signal to be input into the input terminal Tin is stopped and the control circuit 40 cannot reflect the output voltage Vtia of the TIA 10 on the control of the input current Itia of the TIA 10 in an appropriate manner (when the determination voltage Vref is higher than the voltage Vtia in the example of FIG. 2), the FET 42 is switched off and the control circuit 40 suppresses the control of the current Itia. It is therefore possible to prevent the output voltage Vtia of the TIA 10 from being reflected on the control of the input current Itia of the TIA 10 (namely, gain control) in an inappropriate manner.

In addition, when the determination voltage Vref, which is the output voltage of the time constant circuit 32, does not fall within a given range, the safeguard circuit 50 may cause the control circuit 40 to block the current Id. As for the afore-mentioned given range of the determination voltage Vref, preferably, the determination voltage Vref is so set that the voltage Vtia cannot be reflected on the control of the current Itia in an appropriate manner. Furthermore, as described in the first exemplary embodiment, when the determination voltage Vref is higher than a predetermined reference voltage V0, the control circuit 40 may block the current Id.

In accordance with the first exemplary embodiment, the reference voltage V0 is set to the voltage VL in which a predetermined voltage is added to the voltage Vref0. When the determination voltage Vref tends to be higher than the output voltage Vtia from the TIA 10, the control of the control circuit 40 can be suppressed. Accordingly, as indicated by B in FIG. 2, it is possible to prevent the determination voltage Vref from becoming higher than the output voltage Vtia from the TIA 10.

Figure 7:
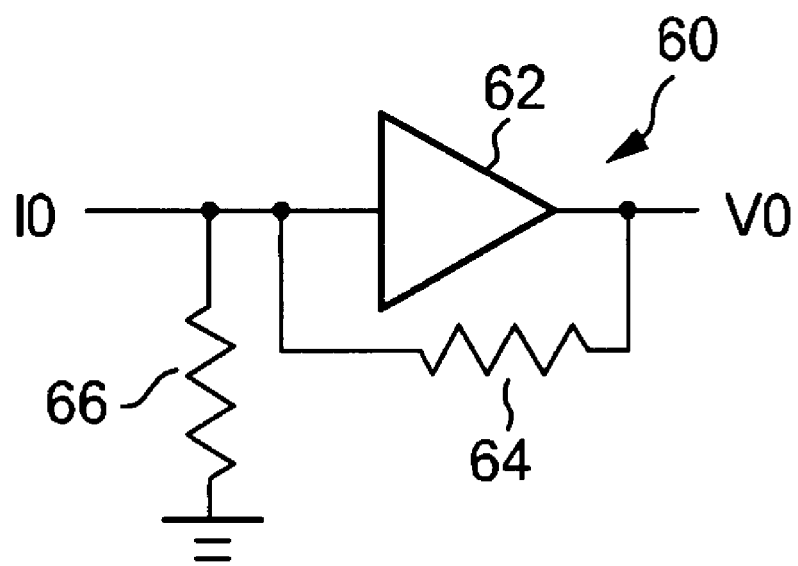
FIG. 7 is a circuit diagram of a reference voltage generating circuit.

FIG. 7 shows an example of a reference voltage generating circuit 60 that generates the reference voltage V0. The reference voltage generating circuit 60 converts a reference current I0 at another TIA 62 into the reference voltage V0, and outputs such converted reference voltage V0. A resistor 64 is a feedback resister. The reference voltage V0 can be shifted to an arbitrary voltage by arbitrarily selecting a resistor 66. In this manner, the reference voltage V0 can be changed into the voltage according to the output from the TIA 62. This make it possible to change the reference voltage V0 in the same manner as the voltage Vref0, even if the voltage Vref0 is varied due to the change in temperature or the change in the power supply voltage.

In addition, the safeguard circuit 50 includes: a comparison circuit that compares a given reference voltage V0 and the determination voltage Vref (output from the time constant circuit 32); and the suppressor circuit 54 that suppresses the control of the input current Itia into the TIA 10, by controlling the current Id of the control circuit 40 on the basis of the output voltage Vcom of the comparison circuit. With such circuit configuration, it is possible to configure the safeguard circuit 50 with ease.

Furthermore, the electronic circuit employed in the first exemplary embodiment includes the differential amplifier circuit 20 into which the output voltage Vtia from the TIA 10 and the determination voltage Vref are input. When the output voltage Vtia and the determination voltage Vref are reversed as shown in FIG. 2, the output Vout from the differential amplifier circuit 20 is varied and exceeds 0 V. This will cause a malfunction in the circuit at the subsequent stage. However, it is possible to prevent the malfunction by use of the technique employed in the first exemplary embodiment.

The electronic circuit employed in the first exemplary embodiment may include another time constant circuit 34 that smoothes the determination voltage Vref, which is an output from the time constant circuit 32. The control circuit 40 may control the current Id on the basis of the output voltage Vagc from the time constant circuit 34. In this manner, the output from the TIA 10 is smoothed by use of the two time constant circuits 32 and 34, thereby enabling the control of the current Id more smoothly.

The time constant circuits 32 and 34 may be respectively composed of: the resistors R1 and R2, respectively connected in series with the output node Ntia of the TIA 10 and with the input node of the control circuit 40; and the capacitors (capacitative elements) C1 and C2, respectively coupled between the input node of the control circuit 40 and the ground potential. This enables the time constant circuits 32 and 34 to be configured with ease.

Second Exemplary Embodiment

Figure 8:
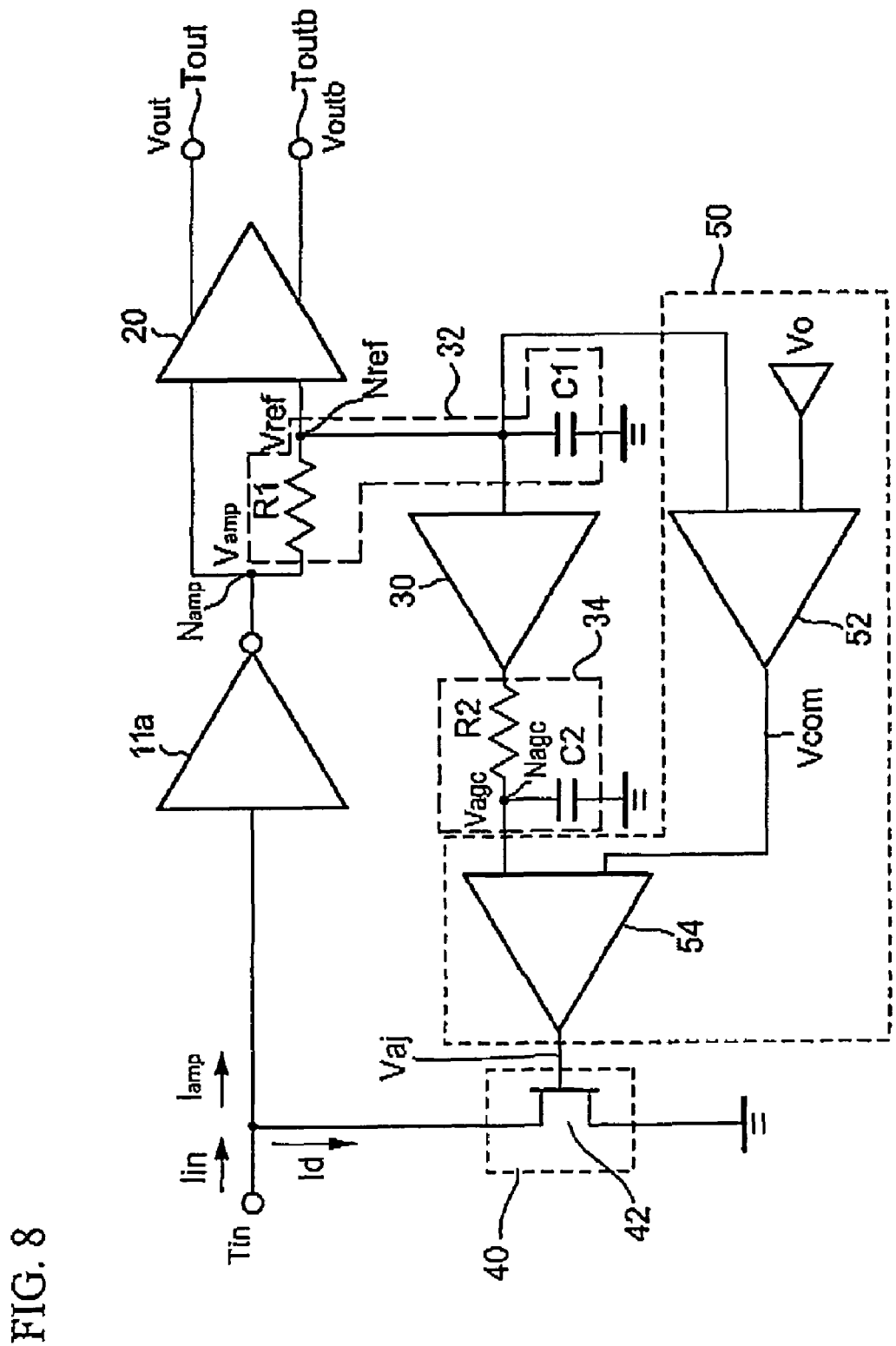
FIG. 8 is a circuit diagram of the electronic circuit in accordance with the second exemplary embodiment of the present invention.

A second exemplary embodiment of the present invention is an example in which the technique of the present invention is applied to a high-impedance amplifier used as an optical communication amplifier. The high-impedance amplifier is an inverted output amplifier. FIG. 8 is a circuit diagram of the electronic circuit in accordance with the second exemplary embodiment of the present invention. As compared to the circuit diagram of FIG. 4 described in the first exemplary embodiment, no feedback resistor R3 is added to an amplifier 11a. In the second exemplary embodiment, the same components and configurations as those employed in the first exemplary embodiment have the same reference numerals and a detailed explanation will be omitted. With respect to the high-impedance amplifier, in the same manner as described with reference to FIG. 1 through FIG. 3, when an input current Iamp into the amplifier 11a is blocked, it takes time as much as the time constant until an output Vamp from the amplifier 11a is fed back. Since the control circuit 40 is causing the current Id to be flown during the time and current is extracted from the amplifier 11a, the input voltage of the amplifier 11a decreases and the potential of the output voltage Vamp of the amplifier 11a increases. Accordingly, the determination voltage Vref smoothing the output voltage Vamp also increases in accordance with the output voltage Vamp.

In the second exemplary embodiment, the safeguard circuit 50 having the comparison circuit 52 and the suppressor circuit 54 is capable of addressing the above-described problem. As stated heretofore, in the first and second exemplary embodiments, in the electronic circuit having a control circuit that inputs (for example, voltage or current) into an optical communication amplifier according to the output (for example, voltage or current) from the TIA 10 of an optical communication amplifier or the amplifier 11a, when a determination element (for example, determination voltage or determination current) determined according to the output from the optical communication amplifier falls within a given range, it is possible to provide a safeguard circuit that suppresses the gain control of the optical communication amplifier of the control circuit. In such electronic circuit, it is possible to prevent the output from the optical communication amplifier from being reflected on the gain control of the optical communication amplifier in an inappropriate manner.

Although a few specific exemplary embodiments employed in the present invention have been shown and described, it would be appreciated by those skilled in the art that changes may be made in these exemplary embodiments without departing from the principles and spirit of the invention, the scope of which is defined in the claims and their equivalents.

The present invention is based on Japanese Patent Application No. 2006-094712 filed on Mar. 30, 2006 and Japanese Patent Application No. 2007-044467 filed on Feb. 23, 2007, the entire disclosure of which is hereby incorporated by reference.

What is claimed is:

1. An electronic circuit comprising:
   an input terminal;
   a transimpedance amplifier connected to the input terminal and including an amplifier and a feedback resistor;
   a first time constant circuit smoothing an output from the transimpedance amplifier;
   a second time constant circuit smoothing an output from the first time constant circuit;
   a gain control circuit arranged between the input terminal and ground potential and controlling current flowing between the input terminal and the ground potential on the basis of the output from the second time constant circuit; and
   a safeguard circuit controlling the gain control circuit and blocking the current flowing between the input terminal and the ground potential on the basis of the output from the first time constant circuit, when a signal to be input into the input terminal is stopped.

2. The electronic circuit as claimed in claim 1, wherein when the output from the first time constant circuit exceeds a predetermined range, the safeguard circuit causes the gain control circuit to block the current flowing between the input terminal and the ground potential.

3. The electronic circuit as claimed in claim 2, wherein when the output from the first time constant circuit is higher than a given reference voltage, the safeguard circuit causes the gain control circuit to block the current flowing between the input terminal and the ground potential.

4. The electronic circuit as claimed in claim 3, wherein the given reference voltage is a value in accordance with an output amplitude of another transimpedance amplifier.

5. The electronic circuit as claimed in claim 3, wherein the safeguard circuit includes a comparator circuit comparing the given reference voltage and the output from the first time constant circuit, and causes the gain control circuit to control the current flowing between the input terminal and the ground potential on the basis of the output from the comparator circuit.

6. The electronic circuit as claimed in claim 1, further comprising:
   a resistor connected in series between the output from the transimpedance amplifier and an input into the gain control circuit; and
   a capacitative element connected between the input into the gain control circuit and the ground potential.

7. An electronic circuit comprising:
   an input terminal;
   an amplifier connected to the input terminal;
   a first time constant circuit smoothing an output from the amplifier;
   a second time constant circuit smoothing an output from the first time constant circuit
   a gain control circuit arranged between the input terminal and ground potential and controlling current flowing between the input terminal and the ground potential on the basis of the output from the second time constant circuit; and
   a safeguard circuit controlling the gain control circuit and blocking the current flowing between the input terminal and the ground potential on the basis of the output from the first time constant circuit, when a signal to be input into the input terminal is stopped.

* * * * *